(12) United States Patent
Okada

(10) Patent No.: US 6,614,178 B1
(45) Date of Patent: Sep. 2, 2003

(54) SOLID-STATE EXCIMER DEVICES AND PROCESSES FOR PRODUCING SAME

(76) Inventor: Fumio Okada, 155-11 Megurita-cho, Kodaira-shi, Tokyo 187-0013 (JP)

(*) Notice: Subject to any disclaimer, the term of this patent is extended or adjusted under 35 U.S.C. 154(b) by 148 days.

(21) Appl. No.: 09/692,194

(22) Filed: Oct. 20, 2000

(30) Foreign Application Priority Data

Oct. 29, 1999 (JP) .......................................... 11-308532

(51) Int. Cl.$^7$ ................................................. H01J 1/62

(52) U.S. Cl. ..................... 313/509; 313/503; 313/506

(58) Field of Search ................................ 313/503, 506, 313/509

(56) References Cited

U.S. PATENT DOCUMENTS

| | | | | |
|---|---|---|---|---|
| H569 H | * | 1/1989 | Varker et al. | 257/297 |
| 6,090,681 A | * | 7/2000 | Yamamoto | 257/309 |

OTHER PUBLICATIONS

Chemical Physics Letters, vol. 154, No. 3, pp. 237–241; Jan. 20, 1989.
Excimer Lasers—Topics in Applied Physics, vol. 30—1984.

* cited by examiner

Primary Examiner—Ashok Patel
Assistant Examiner—Glenn Zimmerman
(74) Attorney, Agent, or Firm—Armstrong, Westerman & Hattori, LLP

(57) ABSTRACT

Useful, new electronic devices are disclosed which utilize the huge polarization and electric double layer generated by excimer formation reaction in solid thin host films doped with excimer forming atoms (rare-gases and halogens: hereinafter, the parent atoms of excimers) at ambient temperature and pressure. A fundamental type of these devices is a single layer solid-state excimer device, which consists of a thin film fabricated by selecting a material from insulating metal oxides, at least one dopant from the parent rare-gas atoms (Ar, Kr and Xe) of excimers, and at least one dopant from parent halogen atoms (F, Cl, Br and I) of excimers. The dopants can be doped in the thin film during its fabrication process. Upper and lower electrodes can be added to the thin film when they are needed, and practical devices can be obtained by fabricating the electrodes and thin film together on a substrate.

16 Claims, 10 Drawing Sheets

SOLID-STATE EXCIMER DEVICES AND PROCESSES FOR PRODUCING SAME

FIELD OF THE INVENTION

The present invention relates to the design and structure of electronic devices in which transition of rare-gas and halogen atoms are electrostatically induced in solid thin films. The electric double layer and large polarization consequently formed in the films are utilized as the operation principle of the devices. The invention also relates to devices with electrodes and the processes for producing the devices.

BACKGROUND OF THE INVENTION

Dielectricity and polarization of conventional dielectric materials used for electronic devices are not large enough for the future development of ultrahigh density memories, ultra-high sensitivity sensors and a new generation of piezoelectric and actuator devices. Therefore, new materials that possess superb dielectric characteristics are required and have been investigated to replace conventional dielectric materials. Studies on the design and preparation of devices are also needed for the application of the new materials.

For example, $BaTiO_3$ is widely known as a high-dielectric material and is used in many devices such as condensers and positive thermal coefficient (PTC) devices. However, the origin and mechanism of dielectric field formation in $BaTiO_3$ crystals are due to the small dislocation, approximately 0.1 angstrom ($0.1 \times 10^{-10}$ m), of central Ti ions relative to the Ba ions in a unit cell.

Similarly, the relative dislocations of central ions in unit cells of conventional ferroelectric materials, such as $PbTiO_3$, $PbZrTiO_3$ and Bi-containing layer-by-layer compounds (so-called Y1 materials), are very small. Since these conventional crystalline materials have the essential restriction that the central ions must move within the sharply bound potential of crystalline unit cells, a long-range charge dislocation, such as a charge-separation on the order of three to four angstroms, cannot principally be expected. Therefore, these materials will not become superdielectric materials that exceed dielectric constants of conventional materials.

Some organic compounds such as liquid crystals also show spontaneous polarization. However, a dislocation of plus and minus charges originating from the presence of functional groups in these materials is limited inside the molecules. Therefore a long-range, i.e., three to four angstroms, charge-separation cannot be expected.

As is mentioned above, the advent of new materials that have charge-separation or dielectric constants one or two orders of magnitude larger than conventional materials have been eagerly awaited. If such materials were invented, they would be called superdielectric materials. The materials will show giant dielectricity and polarization.

On the other hand, excimer-formation is well known as a reaction resulting in a long-distance charge-separation. Excimer lasers and lamps have been commercialized using this reaction. Excimers are metastable species that are formed via high-energy input such as pulse-discharge or ultraviolet (UV) light irradiation on rare-gas/rare-gas or rare-gas/halogen mixtures. The possibility of applying the reaction to laser oscillation and UV light sources has already been realized and discussed in the 1960s.

UV lasers were then commercialized in the 1970s. At present, they are commonly used as light sources in stepper systems for semiconductor processes. Furthermore, successful development of excimer lamps that provide deep UV light has widened the application of excimer-formation reactions in the industry.

Both the physical and chemical understanding of the properties and characteristics of excimers have rapidly progressed. Energy potentials, formation and emission mechanisms, non-radiative relaxation processes and application of the excimer reactions to optical devices are well summarized and published in literature such as "Excimer Lasers, Second Enlargement Edition, ed. by Ch. K. Rhodes, Springer-Verlag (Berlin, Heidelberg, New York, Tokyo, 1984)."

However, application of excimer reactions to industrial fields other than optical devices has not been pursued to date; neither any research nor idea relating to the application of excimer reactions to electronic devices has been reported.

The inventor has long been engaged in researches on "Formation and relaxation mechanisms of excimers in condensed media" and "Preparation and evaluation of electronic thin films." By combining knowledge and experience obtained through these researches, the inventor has formulated the following idea: If excimers could be formed in solid thin films under electrically static conditions, we will have devices that show huge polarization and an electric double layer.

First of all, the inventor's views on characteristics of excimers as potential electronic devices are summarized below:

1) Huge Polarization

As is described before, the relative charge-separation or charge dislocation of conventional dielectric materials is on the order of 0.1 angstrom. On the other hand, excimers are formed when rare-gases and halogens are excited into full-charge-transfer states: plus and minus charges are separated in the excimer molecule by three to four angstroms. Hence excimers have huge polarization compared with conventional dielectric materials. If excimers could be formed in solid thin films, we would have superdielectric materials that have dielectricity two orders of magnitudes higher than conventional materials. Then these films can be applied to ultrahigh-density memories, ultrahigh-sensitivity sensors and a new generation of piezoelectric devices and actuators.

2) Stability in Solid

Excimers easily relax to their ground states by colliding with other molecules in the vapor phase and show low quantum efficiency. In contrast, all of the excimers formed in the solid phase can be used as the driving force of devices because of the lack of collisional deactivation processes.

3) Delocalization of Holes

Holes of excimers trapped in low-temperature solid Xe can be delocalized in the Xe matrix in a manner similar to electrons transiting into their Rydberg states. Delocalized holes are trapped in the matrix without recombining with electrons. Only when the temperature of the matrix is raised, does the recombination of holes and electrons proceed, and recombination luminescence, i.e., thermo-luminescence, is observed. This mechanism was first reported by N. Schwentner, M. E Fajardo and V. A. Apkarian in "Rydberg series of charge-transfer excitations in halogen-doped rare gas crystals," Chem. Phys. Lett., Vol 154, pp.237, (1989). If such delocalization process could be attained in a solod thin film following charge-separation reactions in excimer molecules, it would be possible to form and stabilize the electric double layer. This kind of device could give rise to ultrahigh capacitors, new types of limiters and memories.

4) Varieties of Combinations

There are many excimer species. Molecular sizes, energy levels in excitation and relaxation processes, and transition probabilities of excimers can be controlled by changing the combination of parent atoms, i.e., rare-gases (Ar, Kr, Xe) and halogens (F, Cl, Br, I). Therefore, we can choose the rare-gas and halogen dopants in accordance with the structure and band gap of the host matrix. The flexibility in combining rare-gases and halogens widens the freedom in designing devices. In particular, Xe is very useful for device design, since it can react and make charge-transfer complexes with many kinds of atoms and radicals other than halogens, such as sulfur (S), oxygen (O) and hydroxide (OH) radicals.

Note that all of the characteristics and properties of excimers mentioned above have been investigated and observed in cryogenic rare-gas crystals and liquids by optically exciting the systems with UV light or by electric discharge. In order to apply these characteristics and properties to electronic devices in the real world, development of the following new technologies has been indispensable: doping of parent atoms of excimers into electronic materials such as ceramics; and excimer-formation under ambient temperature and pressure by a static electrical field. The concrete technological problems and strategies of the inventor to develop these breakthroughs are summarized in a) to d).

a) Selection of Host Materials

Since crystals have little flexibility in their matrices, possible dopants for them are very limited. Therefore, the inventor thought it important to select amorphous materials as hosts for parent atoms of excimers. Amorphous materials have an advantage in that they can contain various substances. For example, organic dyes that have high molecular weights can be embedded in a flexible network of amorphous SiOx. Such amorphous compounds should be suitable hosts for doping rare-gases and halogens that have large atomic diameters, and for charge-transfer reactions between them.

b) Doping of Parent Atoms of Excimers

Excimers are gas phase molecules at ambient temperatures and pressures. Therefore, it is difficult to confine them in solids and to operate them under ambient circumstances. The inventor has succeeded in doping parent atoms of excimers by sputtering process that is one representative of a non-equilibrium processes. During the formation of host-matrix thin films by sputtering process, parent atoms of excimers are used as sputtering gases. The parent atoms are ionized and form high-energy plasmas in the process. These high-energy species can successfully enter and be trapped in thin films.

c) Operation at Low Voltages

High-energy excitation processes, such as electric discharge or UV light irradiation, are required to produce excimers, since energy gaps between the ground and excited states of excimers are very wide. However, it is difficult to apply electrical discharge or UV light irradiation to solid devices doped with parent atoms of excimers, since the system becomes complicated, expensive and massive. Operation of the systems under one to several tens of DC or AC volts is a precondition for practical use of them as electronic devices. If parent atoms of excimers were doped in bulk materials, it would be impossible to induce charge-transfer reactions under such low electric fields. Therefore, the inventor pursued thin film fabrication, and developed a breakthrough in operating the system under low voltages. The alternative application of excimer devices by light irradiation will be discussed later in this patent.

d) Operation Temperature

The delocalization of hole of excimers has only been observed in cryogenic Xe matrices. The inventor at first thought it would be necessary to decrease the operating temperature to exploit the delocalization characteristics of excimers in electronic devices. That is, cooling the device seemed to be important to separate and stabilize the plus and minus charges.

However, astonishingly enough, when the device was prepared and tested, it was found that charge-transfer reactions can be reversibly repeated in the film, and the device showed large polarization and space charge at room temperature. No cooling was necessary for the operation.

SUMMARY OF THE INVENTION

The inventor has conducted researches to develop fundamental breakthroughs in the four problems mentioned above, and has completed the establishment of new technologies. They are the body of this invention. As a result, many types of devices have been created using these technologies. These devices, hereafter, will be called "solid-state excimer devices" as a general term.

The invention realizes useful electronic devices that utilize the huge polarization and electric double layer generated by excimer formation in solid thin host films doped with excimer forming atoms (rare-gases and halogens: hereafter the parent atoms of excimers) at ambient temperature and pressure.

The fundamental scheme of the invention is the single layer solid-state excimer device. This device consists of a thin film fabricated by selecting a material from insulating metal oxides, at least one dopant from the parent rare-gas atoms (Ar, Kr and Xe) of excimers, and at least one dopant from parent halogen atoms (F, Cl, Br and I) of excimers. The dopants can be doped in the thin film during its fabrication process.

In other words, the thin film doped with the parent atoms of excimers is the most important and essential constituent element of the invention. Upper and lower electrodes can be added to the film when they are needed, and practical devices can be obtained by fabricating the electrodes and thin film together on a substrate. The details of the structure and the preparation process of the device are explained in the following sections.

Any kind of material can be used as a substrate of the device. For example, silicon, germanium, gallium arsenide, indium phosphorus, silicon oxide, aluminum oxide, metal plates and foils, glasses and plastics, can be selected as substrate materials. Neither precise orientation nor surface smoothness is required for the substrates. The preparation of the lower electrode, which is usually inserted between the substrate and the thin film, is unnecessary if conductive materials such as metal plates and foils are used as substrates, or if the film is excited by methods other than applying voltage to the film. When a film fabricated on an insulating substrate is to be excited by applying voltage, a lower electrode is needed between the substrates and films. In this case, any kind of conductive material, such as gold, silver, platinum, indium tin oxide (ITO) and iridium oxide, can be used as a material for the lower electrodes. The lower electrode does not require specific characteristics other than conductivity, and neither precise orientation nor surface smoothness is required for the electrode.

The reason why neither crystallinity nor surface precision is required for substrates and electrodes is that the films doped with parent atoms of excimers can be fabricated on any kind of surface, since the films are amorphous. If reaction or diffusion among the films, electrodes and substrates is anticipated, reaction-preventive thin films (buffer layers) represented by such materials as cerium oxide, aluminum oxide and yttrium-stabilized zirconium oxide (YSZ) can be inserted between substrates and electrodes or between electrodes and the films.

Doping of parent atoms of excimers into host materials can be achieved using a sputtering process where sputtering gases that contain the parent atoms are used during the fabrication of host materials on substrates or on the lower electrodes prepared on substrates.

In this procedure, the selected parent atoms of excimers are trapped inside thin films as a target made of a selected host material for the film is sputtered by gas-phase discharge in the sputtering gases that contain the parent atoms. The film is fabricated together with the dopant parent atoms of excimers on a substrate or on a lower electrode prepared on the substrate. For the sputtering gas, at least one kind of atoms should be selected from the rare-gases, Ar, Kr and Xe, and at least one kind of atom should be selected from the halogens, F, Cl, Br and I. Other kinds of gases such as Ne, He or $N_2$ can simultaneously be used as remaining component of the sputtering gas, but they are not indispensable for the preparation of the devices. The sputtering conditions and dose of the parent atoms of excimers can be controlled by adjusting the ratio and flow rates of rare-gas/halogen mixtures as well as the sputtering pressure.

The single layer solid-state excimer devices are to be used as ferroelectric devices as described in the following paragraphs and example-1. Insulating host materials are favored for the thin films in these devices, since current leakage is prohibited in ferroelectric applications. For example, either crystalline or amorphous phases of the following materials, as well as their solid solutions can be used as the host for single layer solid-state excimer devices: aluminum oxide, barium oxide, bismuth oxide, cerium oxide, cobalt oxide, copper oxide, iron oxide, gallium oxide, gadolinium oxide, germanium oxide, lanthanum oxide, lithium oxide, magnesium oxide, manganese oxide, molybdenum oxide, niobium oxide, neodymium, oxide, nickel oxide, lead oxide, silicon oxide, strontium oxide, titanium oxide, vanadium oxide, tungsten oxide, yttrium oxide and zirconium oxide.

In the state of targets, the morphologies of host materials can either be crystalline or amorphous phases. However, during the sputtering stage the target materials should be fabricated to be amorphous or nanocrystalline thin films so that parent atoms with large atomic diameters can be trapped into the host films. In amorphous phases, the compositions of materials sometimes deviate from their stoichiometric values. For example, the composition of a silicon oxide host, i e., the O/Si ratio, produced by the procedure described above was 1.9, while the stoichiometric composition of the target quartz is 2. Therefore, the composition of such host films should be written as SiOx.

In this section the preparation process of thin films doped with parent atoms of excimers is explained in detail. There are many conventional processes for the fabrication of thin films. Sputtering, plasma chemical vapor deposition (plasma CVD) and ion implantation are well-known processes for the fabrication, and any of them can be utilized for the purpose of fabricating a thin film doped with parent atoms of excimers as far as doping of rare-gases and halogens into films is possible. However, sputtering is superior to the other processes in terms of simplicity, cost of operation and ease of preparing lower and upper electrodes. A brief comparison of the representative three fabrication processes is given below.

i) Sputtering

By mixing parent atoms of excimers in sputtering gas, these atoms can easily be doped into host films by sputtering. Furthermore, it is possible to carry out the entire fabrication processes using one apparatus, if multi-target sputtering equipment is used. That is, fabrication of a lower electrode on a substrate, a thin film doped with parent atoms of excimers on the lower electrode, and an upper electrode on the thin film can be carried out in the same equipment. There is no need to convey a substrate in and out of the chamber, fit a substrate to the substrate holder and evacuate the chamber three or four times, if a mask-patterning process is not necessary. Therefore, products with few stains and scars are obtainable.

ii) Plasma CVD

It is possible to dope parent atoms of excimers in thin films by plasma CVD, since rare-gas and halogens are ionized to form plasmas which have sufficiently high-energy levels for the atoms to be embedded into the films. However, the doping process and procedure in plasma CVD is more complicated than those in sputtering.

For example, let us think about one of the simplest plasma CVD processes in which SiOx thin films are fabricated from silane gas and parent atoms of excimers are doped simultaneously. We have to use many gases in this process: silane gas should be used as the raw material for the host film, oxygen gas is also needed as oxidant for silane, rare-gas and halogen gas should be added to these gases as dopants. Therefore, the apparatus and procedure become very complicated. In addition to the doped rare-gases and halogens, impurities such as hydrogen and hydroxyl radicals could also be trapped in the films, and these impurities will degrade the film properties. Furthermore, it is difficult to fabricate lower and upper electrodes using the same apparatus as is used for fabrication of the SiOx films. Therefore, the plasma CVD does not have any advantages over the sputtering.

iii) Ion Implantation

Embedding many kinds of ions into thin films and substrates is widely performed by ion implantation. It is also possible to dope rare-gas and halogen ions into films by ion implantation. However, the apparatus that enables simultaneous and uniform implantation of plus (rare-gas) and minus (halogen) ions into a film or that enables fabrication and implantation procedures simultaneously is very complicated and expensive. Such an apparatus is very rare and limited in use to date. Moreover, the operating cost of such apparatus is very high. Therefore, ion implantation is inferior to sputtering for fabricating films doped with parent atoms of excimers.

As is explained above, these processes can be applied for fabricating the films doped with parent atoms of excimers, and the films can be fabricated either directly on a substrate or on a lower electrode formed on a substrate. An upper electrode using any kind of material can be formed on the films to apply voltage between the lower and upper electrodes. Any kind of conductive material, such as gold, silver, platinum, indium tin oxide (ITO) and iridium oxide, can be used as a material for the upper electrodes, and the upper electrodes do not require orientation, epitaxiality or surface precision.

Note that the use of lower and upper electrodes is not described in claims No. 1 and No. 3 of the invention, because the possible application of solid-state excimer devices to systems that do not need electrodes is considered. However, the invention does not deny the use of the electrodes.

The action of solid-state excimer devices is explained by a fundamental example, in which a SiOx film is used as an insulating host material and both Xe and F atoms are codoped as parent atoms of XeF excimers into the SiOx film. This structure is defined and hereafter called as single layer solid-state excimer devices.

In this case, monovalent F atoms doped in a SiOx film replace divalent oxygen atoms. Therefore, dangling bonds exist adjacent to F atoms. Xe atoms are trapped in the film partially supplying their outer-shell electrons to the dangling bonds. Therefore Xe atoms exist in the neighborhood of F atoms in the film. When several or some tens of volts is applied to the film, a large electric field on the order of several tens of kV/cm is generated in the film, since the film is very thin. Because of the large electric field, electrons of doped Xe atoms hop toward F atoms in the direction of the electric field, and excimers are formed by the following charge-transfer reaction (harpooning reaction):

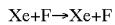

If Xe and F atoms are codoped in the same insulating thin film, outer-shell electrons of Xe atoms compensate for the dangling bonds in the film in their ground state, and an ideal ferroelectric film with very little current leakage can be obtained. Solid-state excimer devices using such thin films can be used as capacitors, piezoelectric devices, ultrasonic devices, actuators, pyroelectric sensors and ferroelectric memories.

BRIEF DESCRIPTION OF THE DRAWING

The present invention can be further understood by reference to the following description and attached drawing which illustrates the preferred embodiments. In the drawing.

DESCRIPTION OF THE PREFERRED EMBODIMENTS

First Embodiment

Figure 1A:
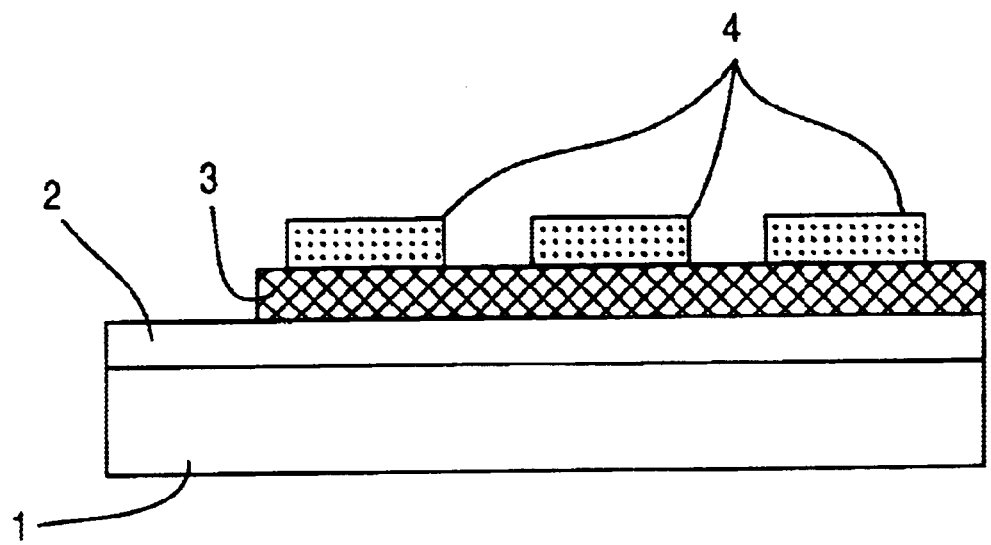
FIGS. 1A and 1B are a cross-sectional side view and a plane view, respectively, illustrating the structure of a single layer solid-state excimer device made of a SiOx film codoped with F and Xe.

The simplest and most fundamental structure of the invention, a single layer solid-state excimer device, has already been explained in the summary of the invention.

In the first embodiment of the present invention, a double layer solid-state excimer device is explained. This device consists of two layers of thin films in contact with each other: one of the films has at least one kind of parent rare-gas atom of excimers selected from Ar, Kr and Xe as a dopant; and the other film has at least one kind of parent halogen atom of excimers selected from F, Cl, Br and I as a dopant.

An example of the preparation procedures of the double layer solid-state excimer devices is as follows:

The first layer thin film is fabricated by sputtering. During the fabrication of this film, at least one kind of parent atom of excimers, such as Xe, is doped in the film. Then the second layer thin film is fabricated on the first film by sputtering. During the fabrication of the second film, at least one kind of parent atom of excimers, such as F, is doped in the film. If a rare-gas or rare-gases are doped in the first film, a halogen or halogens should be doped in the second film and vice versa.

Even if insulating targets are used as raw materials for the double layer films, the fabricated films become p-type semiconductors, since the doped rare-gas and halogen atoms act as carriers in each layer. Outer-shell electrons of rare-gases cannot compensate dangling bonds, since halogen atoms do not exist near rare-gas atoms in this configuration of the device. Therefore, one need not limit the targets to insulating materials and can use a various materials as targets, but not metals. In addition to the insulating materials listed in the single layer excimer devices, the following materials can be used as host films: conductive metal oxides such as iridium oxide, tin oxide, zinc oxide, ruthenium oxide, indium tin oxide and their amorphous phases; group IV semiconductors such as silicon, germanium, their amorphous phases and their solid solutions; group III–V compound semiconductors such as gallium arsenide, indium phosphorus, gallium nitride, their amorphous phases and their solid solutions; group I–VI compound semiconductors such as cadmium tellurium, zinc selenium, zinc tellurium, their amorphous phases and their solid solutions. Metals are excluded from the host materials for the invention, since they do not become semiconductors even if they are doped with rare-gases or halogens. Their resistance is too small to build up sufficient electric field to induce charge-transfer reactions between rare-gases and halogens.

When an electric field that exceeds the threshold value is applied to the double layer films as is prepared by the process described previously, charge-transfer reactions are induced at the boundary of the films. Then the holes and electrons are delocalized in the films, and one film becomes statically charged to plus and the other film to minus. In this way, electric double layers, i.e., induced p-n junctions, are formed in the devices.

For example, an F-doped SiOx layer was fabricated on a Xe-doped SiOx layer using quartz as a target material, following the procedure described above. The two layers showed characteristics similar to those of p-type semiconductors. The layers showed ohmic resistance in both AC and DC modes below the threshold voltage. However, once an electric field above the threshold voltage was applied to the layers, a charge-transfer reaction took place between Xe atoms in a Xe-doped SiOx film and F atoms in a F-doped SiOx film. As a result, the Xe-doped SiOx layer was charged to plus and the F-doped SiOx layer was charged to minus: electric double layers were successfully induced at the threshold voltage. Induced p-n junction formation was achieved by applying a static electrical field to the layers. Such sudden changes in electric properties should be useful for application of the layers to electrical limiters, capacitors and memories.

Moreover, the free energy and matrix structure of the layers are dramatically changed by induced p-n junction formation, and strong electric distortion were generated in the films. By using such characteristics of the films, high-efficiency piezoelectric devices and new types of microactuators can be produced.

Second Embodiment

In the second embodiment of the present invention, a multi layer solid-state excimer device is explained. To obtain multi layer devices the above-mentioned double layers are fabricated one on the top of another, in the same order.

Since electrical double layers are formed and connected in series in this device, the electrical limiting property of the device will become sharper and clearer than that of the double layer solid-state excimer device.

Third Embodiment

In the third embodiment, a multi layer solid-state excimer device with inter-layer electrodes is explained.

In this device, the set of double layers are fabricated one on top of another, in a different order: if the first set of the double layer has the F-doped film on the Xe-doped one, the second set of the double layer has reversed order, the Xe-doped film on the F-doped one. The rest sets of the double layer should have such alternate orders. The inter-layer electrodes are inserted into each set of double layers.

In the multi layer solid-state excimer device with inter-layer electrodes, each set of double layers constitutes a capacitor. When the same poles are connected to each other, each capacitor lays in parallel order in the device. As a whole, the device has a large capacity in a small volume, a so-called supercapacitor.

Fourth Embodiment

In the fourth embodiment of the present invention, a solid-state excimer device used as a light-regulating glass by absorbing or reflecting light rays. In these cases, thin films doped with parent atoms of excimers can be used without electrodes. For example, UV light of a predetermined wave length from the sun can be absorbed in transparent thin films doped with parent atoms of excimers fabricated on window glasses, in which excimers are formed by the UV light.

The same structure can be used as optical memory devices. In such devices, transparent thin films doped with parent atoms of excimers are fabricated on substrates and act as memory media by absorbing UV laser light and by changing the transmittance of the irradiated part of films. For example, the use of this kind of film in optical memories such as opto-magnetic disks and laser disks is possible. It is also possible to optically and electrically excite the films at the same time to change optical properties of the films.

EXAMPLES

Example-1

An ITO lower electrode with a thickness of 0.1 $\mu$m was fabricated on a quartz substrate which had an area of 25×25 mm$^2$ and a thickness of 0.5 mm by sputtering method.

The fabrication conditions for the ITO electrode were as follows:

substrate temperature: 300° C.

sputtering gas and flow rate: Ar, 100 cm$^3$/min sputtering pressure: 2×10$^{-3}$ Torr (1 Torr is 133 Pa)

DC sputtering power: 40 W (400 V, 0.1 A)

sputtering time: 10 min

Then a SiOx thin film, that was codoped with F and Xe and was 0.3 $\mu$m thick, was fabricated on the lower electrode by RF sputtering of a SiO$_2$ target using a F$_2$ (10%)/Xe (90%) mixture as a sputtering gas. Finally, three Pt upper electrodes, each having a thickness of 0.1 $\mu$m and an area of 50 mm$^2$, were formed on the SiOx film by RF sputtering.

The fabrication conditions of the SiOx film were as follows:

substrate temperature: room temperature (the substrate was not heated)

sputtering gas and flow rate: F$_2$ (10%)/Xe (90%) mixture, 30 cm$^3$/min sputtering pressure: 2×10$^{-3}$ Torr RF power: 800 W (the reflection wave power was 10 W)

sputtering time: 60 min

Figure 1B:
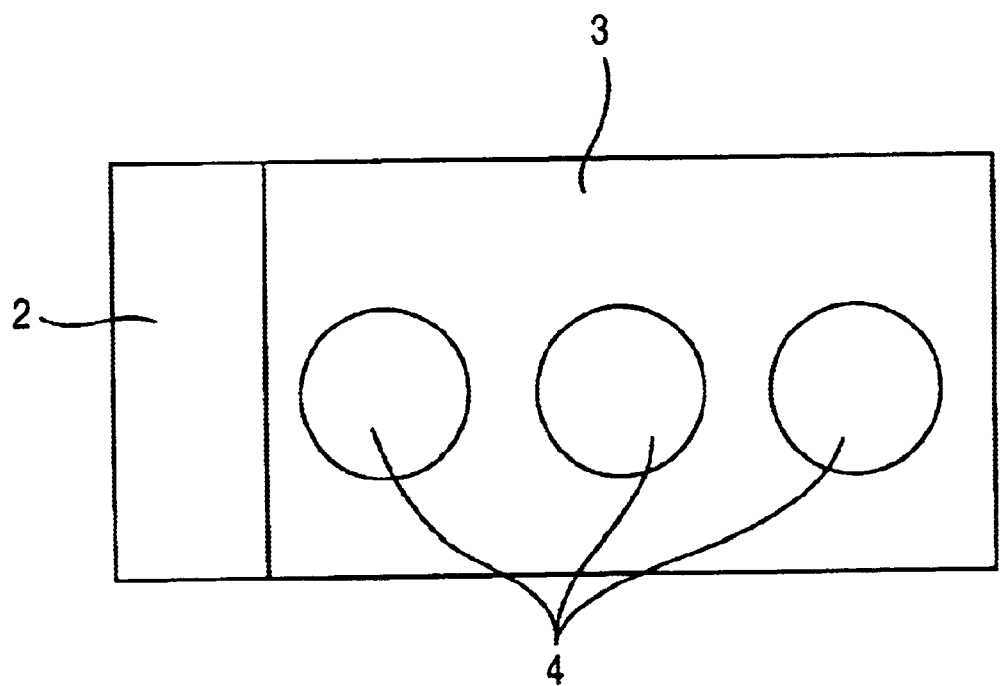

FIGS. 1A and 1B illustrate the structure of the single layer solid-state excimer device having a SiOx film codoped with F and Xe, according to the example-1. The reference numerals 1, 2, 3 and 4 indicate the substrate made of quartz, the ITO lower electrode formed on the substrate 1, a SiOx film codoped with F and Xe fabricated on the electrode 2, and the Pt upper electrode formed on the film 3, respectively.

The results of energy dispersion X-ray analysis (EDX) of the SiOx film indicated that parent atoms, F and Xe, of the XeF excimer were successfully doped in the film. The doses of F and Xe atoms in the film were 7 at. % and 0.2 at. %, respectively. These atoms probably substitute for O atoms in the film, since the O/Si ratio of the film was found to be 1.9, which is less than the stoichiometric value of 2 of the quartz target. The results of X-ray diffraction measurements indicated that the film was amorphous.

The reason why three upper electrodes were prepared on the same SiOx film was to check properties of the device from many points of view such as measurements of the destruction voltage of the insulating layer, and resistance distribution in the device. Normally, one electrode is sufficient for the device.

The fabrication conditions for the upper electrodes were as follows:

substrate temperature: room temperature (the substrate was not heated)

sputtering gas and flow rate: Ar, 20 cm$^3$/min sputtering pressure: 2×10$^{-3}$ Torr RF power: 100 W sputtering time: 5 min The resistive characteristics of the device were measured by connecting the device to the electric circuit shown in FIG. 2. As a result, the SiOx film showed a large resistance that exceeded the measurable range, 40 M$\Omega$, of the electric tester used in the circuit with and without applied voltages. The destruction voltage of the insulator, 80 V, was very high and that is equivalent to an electric field of 2.7 M$\Omega$/cm.

Then the device was set in an inductivity measurement instrument unit and the dielectric constant of the film was measured. As a result, the SiOx thin film codoped with F and Xe was found to be a ferroelectric material with a remnant polarization of 110 $\mu$C/cm$^2$, a coercive electric field of $1.5 \times 10^5$ V/cm, and a tan δ of 2%. The remnant polarization of the film is two or three times is larger than those of conventional ferroelectric materials such as PZT. The fact that the SiOx film fabricated at room temperature showed a larger remnant polarization than the conventional film epitaxially fabricated at high temperature was astonishing and has not been reported to date. If fabrication conditions such as the dose of the parent atoms of excimers, film thickness and electrode materials could be optimized, the film would show better performance.

From the results of these measurements, the film was found to be useful in piezoelectric, supersonic and pyroelectric devices as well as in actuators and ferroelectric memories.

Although the substrate was heated only when the lower electrode was fabricated on the substrate to obtain conductivity in the ITO film, substrate heating may not be necessary if a metal electrode, such as Pt and gold, is used as the lower electrode. That means the entire preparation process of the device can preceed at room temperature without heating the substrate. The ITO was used as the lower electrode in the device mentioned above to check if there is any excimer emission from the thin film.

Comparison to Example-1

To check the effect of doping parent atoms of excimers into a SiOx film, a similar film was fabricated by changing the sputtering gas from the $F_2$/Xe mixture to pure Ar, and the electric properties of the film were measured. The resistance and destruction voltage of the Ar-doped SiOx film was almost the same as the F- and Xe-doped film. However, the film obtained using pure Ar as a sputtering gas did not show any ferroelectricity or high dielectric properties.

Example-2

Similar to the sample explained in example-1, an ITO lower electrode with a thickness of 0.1 μm was fabricated on a quartz substrate which had an area of 25×25 mm$^2$ and a thickness of 0.5 mm by sputtering.

The fabrication conditions for the ITO electrode were as follows:

substrate temperature: 300° C.

sputtering gas and flow rate: Ar, 100 cm$^3$/min sputtering pressure: $2 \times 10^{-3}$ Torr (1 Torr is 133 Pa)

DC sputtering power: 48 W (400 V, 0.12 A)

sputtering time: 10 min

Then a SiOx thin film doped with Xe was fabricated on the lower electrode by RF sputtering of a $SiO_2$ target using pure Xe (99.9%) as a sputtering gas. Another SiOx thin film doped with F was fabricated on the previously formed SiOx film by RF sputtering of a $SiO_2$ target using a $F_2$ (10%)/Ne (90%) mixture as a sputtering gas.

The thickness of the double layer thin film was 0.9 μm in total, and the fabrication conditions were as follows:

substrate temperature: room temperature (the substrate was not heated)

sputtering gas and flow rate: pure Xe for the first layer, 30 cm$^3$/min and $F_2$ (10%)/Ne (90%) mixture for the second layer, 100 cm$^3$/min sputtering pressure: $2 \times 10^{-3}$ Torr RF power: 800 W (the reflection wave power was 10 W)

sputtering time: 20 min for each layer

From the results of x-ray diffraction measurements, the double layer was found to be amorphous.

A Pt upper electrode with a thickness of 0.1 μm and area of 100 mm$^2$ was fabricated on the SiOx double layer by RF sputtering.

The fabrication conditions for the upper electrodes were as follows:

substrate temperature: 300° C.

sputtering gas and flow rate: Ar, 20 cm$^3$/min sputtering pressure: $2 \times 10^{-3}$ Torr RF power: 100 W sputtering time: 5 min The substrate was heated during fabrication of the upper electrode in this example, since the surface morphology of example-1 was different from that of a mirror and a poor adhesive property of the electrode was anticipated. However, the surface morphology of the Pt electrode fabricated by heating the substrate was also poor and a surface similar to that of a mirror could not be obtained by this procedure.

The cross-sectional observation of this device using a field-emission scanning electron microscope (FE-SEM) revealed that the surface morphology of the Pt upper electrode, as well as that of SiOx layers, was uneven which was affected by the uneven surface morphology of the ITO lower electrode. Although the surface morphologies of those layers were uneven, the electric properties of the devices were not markedly affected.

Figure 3A:
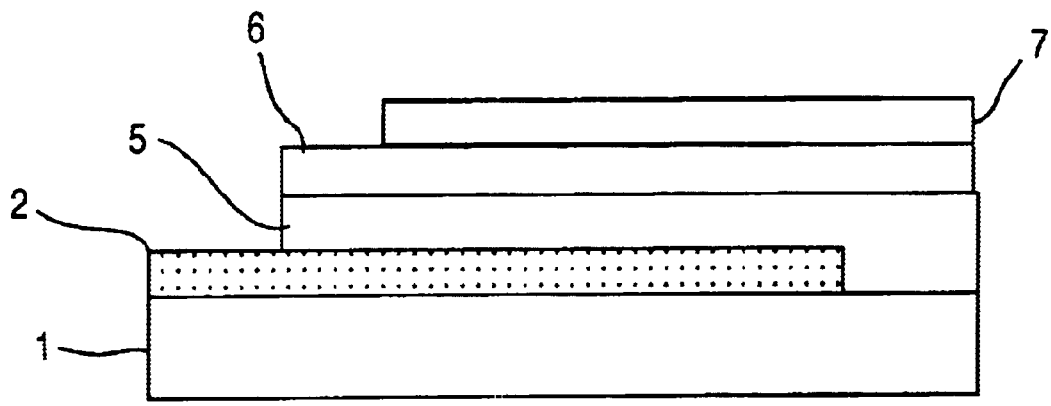
FIGS. 3A and 3B are a cross-sectional side view and a plane view, respectively, illustrating the structure of a double layer solid-state excimer device that has a SiOx film doped with Xe and a SiOx film doped with F.
Figure 3B:
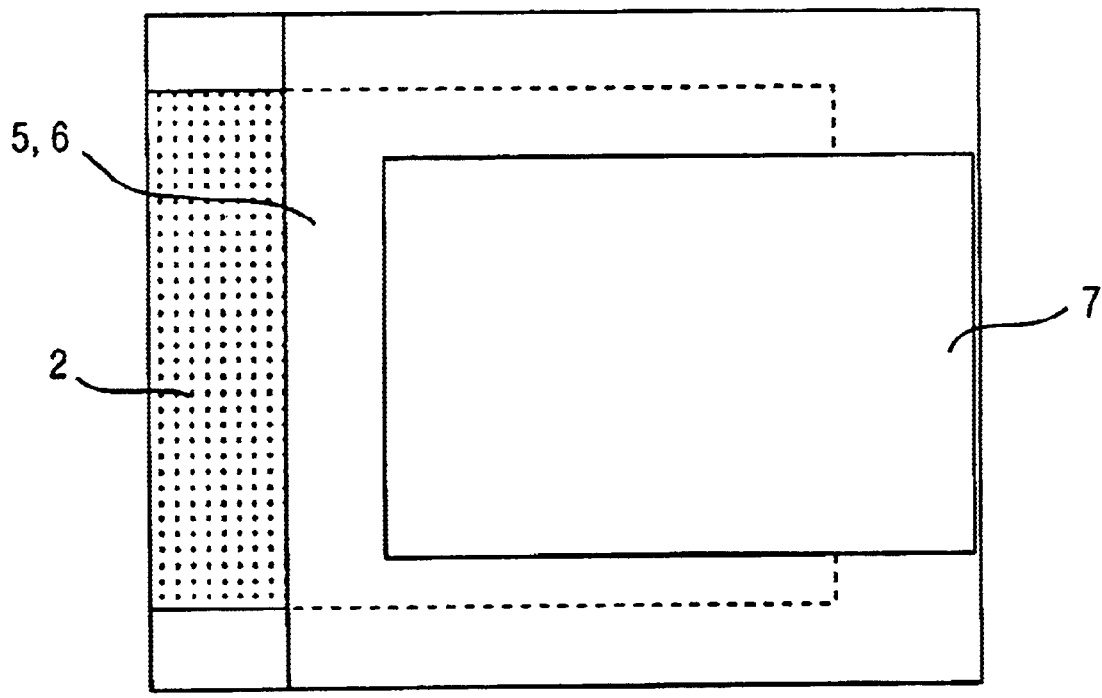

FIGS. 3A and 3B illustrate the structure of the Xe-doped and F-doped double layer solid-state excimer device, according to the example-2. The reference numerals 1, 2, 5, 6 and 7 indicate the quartz substrate, the ITO lower electrode fabricated on the substrate 1, the Xe-doped SiOx film fabricated on the lower electrode 2, the F-doped SiOx film fabricated on the Xe-doped SiOx film 5 and the Pt electrode fabricated on the F-doped SiOx film 6, respectively.

Figure 2:
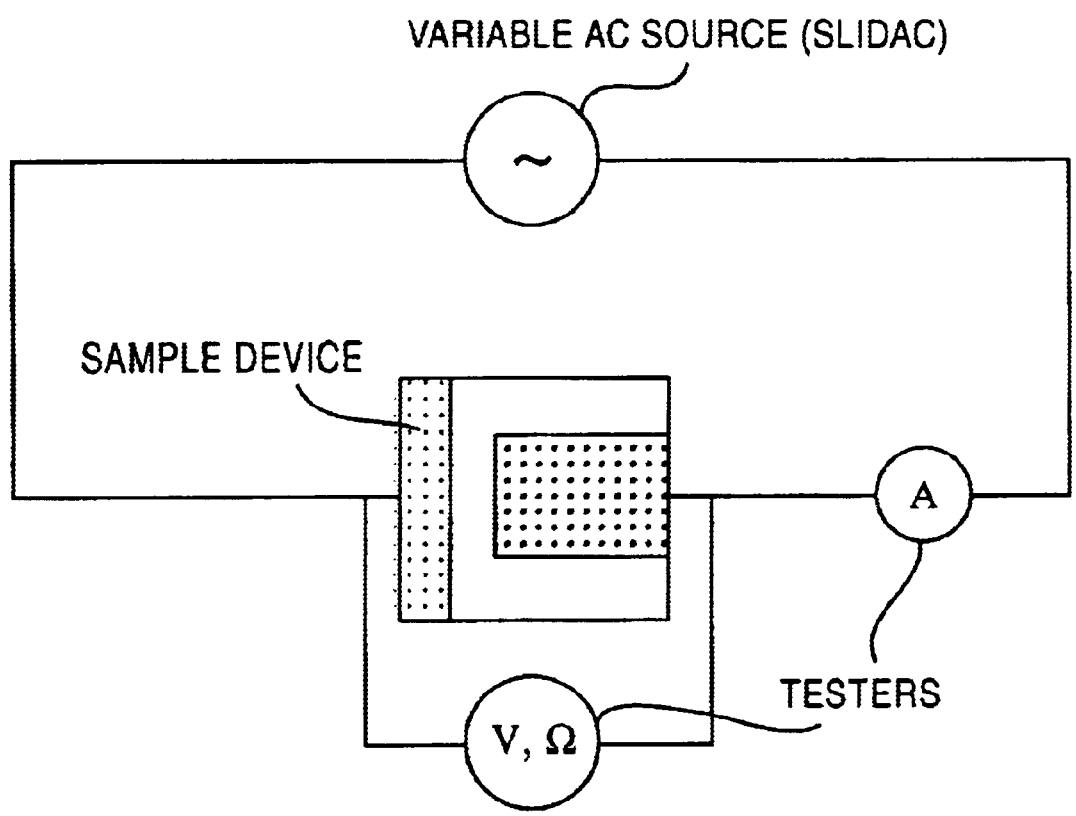
FIG. 2 illustrates a circuit for measurement of resistive characteristics of the devices.

The resistive characteristics of the device were evaluated by connecting the device to the electric circuit shown in FIG. 2. The resistance between the upper and lower electrodes was measured to be 20 Ω by an electric tester without applying voltage between the electrodes. The resistance calculated from the thickness, 0.9 μm, and area, 100 mm$^2$, of the film was $2 \times 10^5$ Ω·cm, which indicated that the device was a semiconductor. The resistivity of this device is 10 orders of magnitude smaller than that of the bulk $SiO_2$ crystals.

Upon applying AC electric fields of 0 to 12 V, this device showed a resistance of 20 Ω. However, when 13 V was applied, the resistance of the device suddenly increased to more than 40 MΩ, the measurable upper limit of the electric tester in the circuit. That is, the current of the device linearly increases with applied voltage from 0 to 12 V, and at an applied voltage of 13 V the resistance of the device abruptly increases by more than $2 \times 10^6$ times of the value at low voltage resulting in no current through the device.

Figure 4:
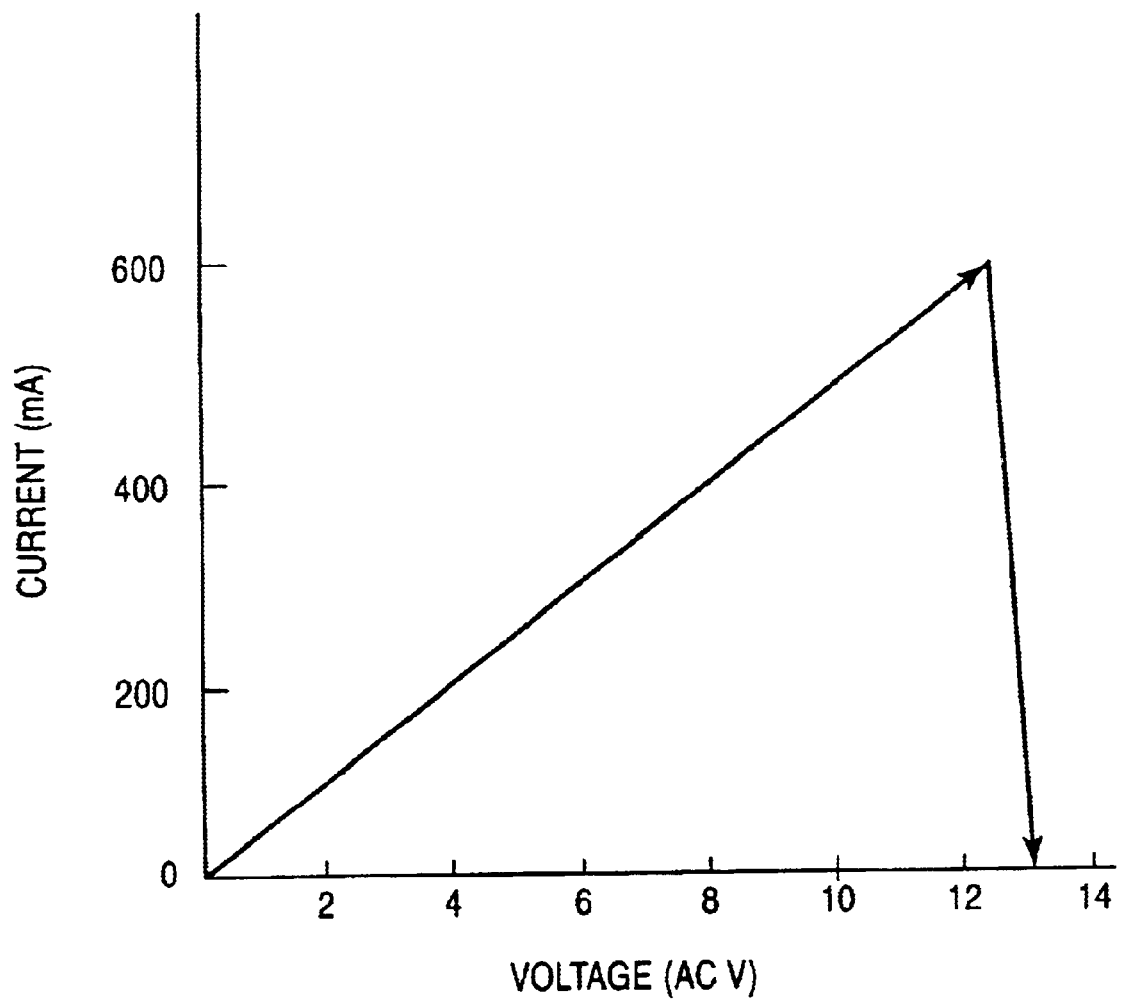
FIG. 4 is a graph showing the I-V characteristics (AC 50 Hz) of the double layer solid-state excimer device that is shown in FIGS. 3A and 3B.
Figure 5:
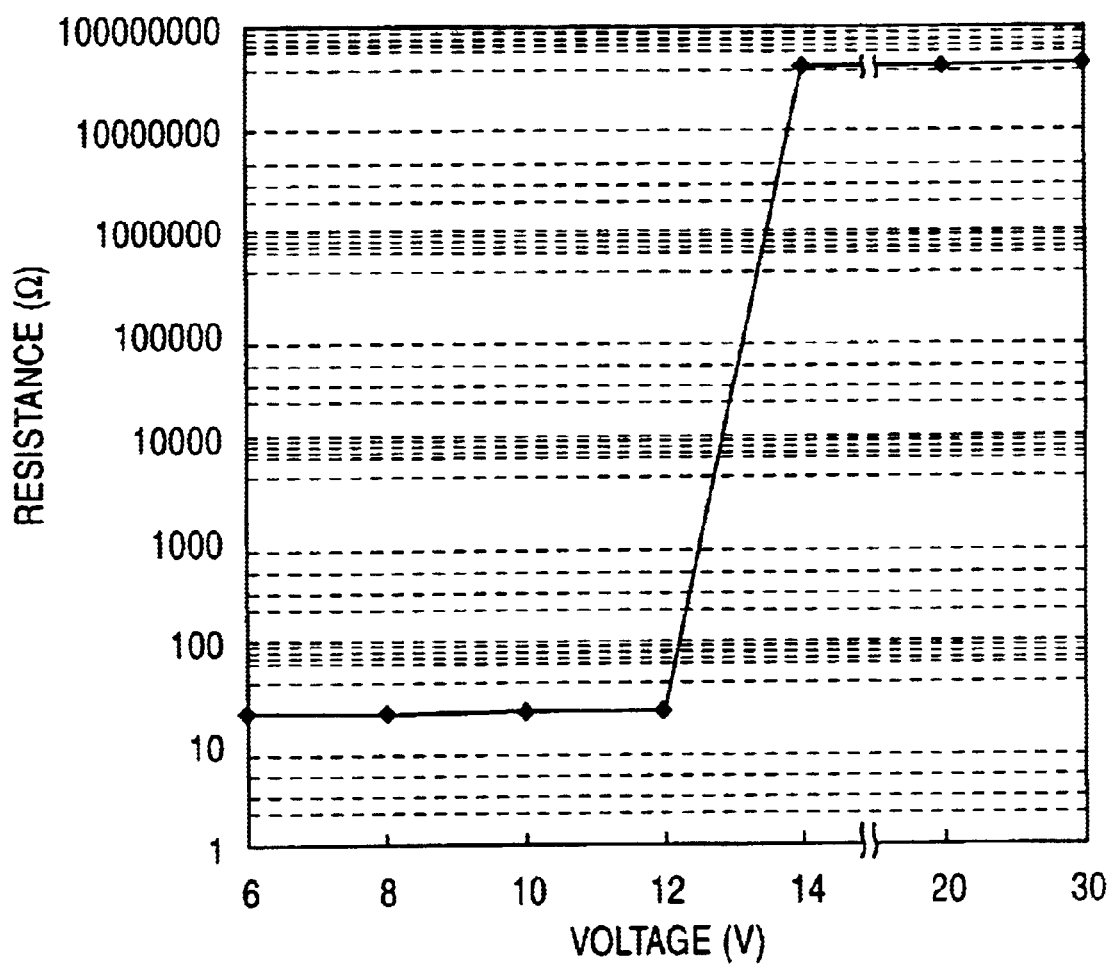
FIG. 5 is a graph showing the relationship between voltage and resistance in the double layer solid-state excimer device shown in FIGS. 3A and 3B.

These phenomena were found to be reversible. There was no destruction of insulating resistance up to 55 V, and the device showed a resistance of over 40 MΩ at any voltages from 13 to 55 V. The AC V-I characteristics and the resistance change of this device are shown in FIG. 4 and FIG. 5, respectively.

The mechanism of these phenomena can probably be attributed to prohibition of the movement of holes and electrons caused by sudden formation of an electric double layer through a charge-transfer reaction, Xe+F→Xe+F, induced by the applied electric field.

A sudden increase in resistance is generally seen in positive thermo-coefficient (PTC) materials when they are heated to a certain temperature. However, the mechanisms of the changes in resistance are completely different; PTC materials generate structural change at grain boundaries, while a charge-transfer reaction and resultant induced p-n junction formation are the origin of the change in resistance of this device. Moreover, the orders of increments in the resistance of PTC materials are at the most 105 times, while that of the double layer solid-state excimer device exceeds 106. The latter has a larger change in resistance, although the exact resistance could not be measured because of the limited measurable range, 40 MΩ, of the tester. Such material can be used as current limiters for IC and LSI circuits.

After the resistance of the device increases, it does not return to the initial value, 20 Ω, for more than an hour if it is connected to the circuit and left untouched. The resistance very gradually decreases, perhaps because of current leakage from the circuit. From this observation, the device was found to behave as a capacitor and can maintain the separated charge for a long period. This property of the device can be applied to new electric double layer capacitors, e.g., new batteries.

Figure 6:
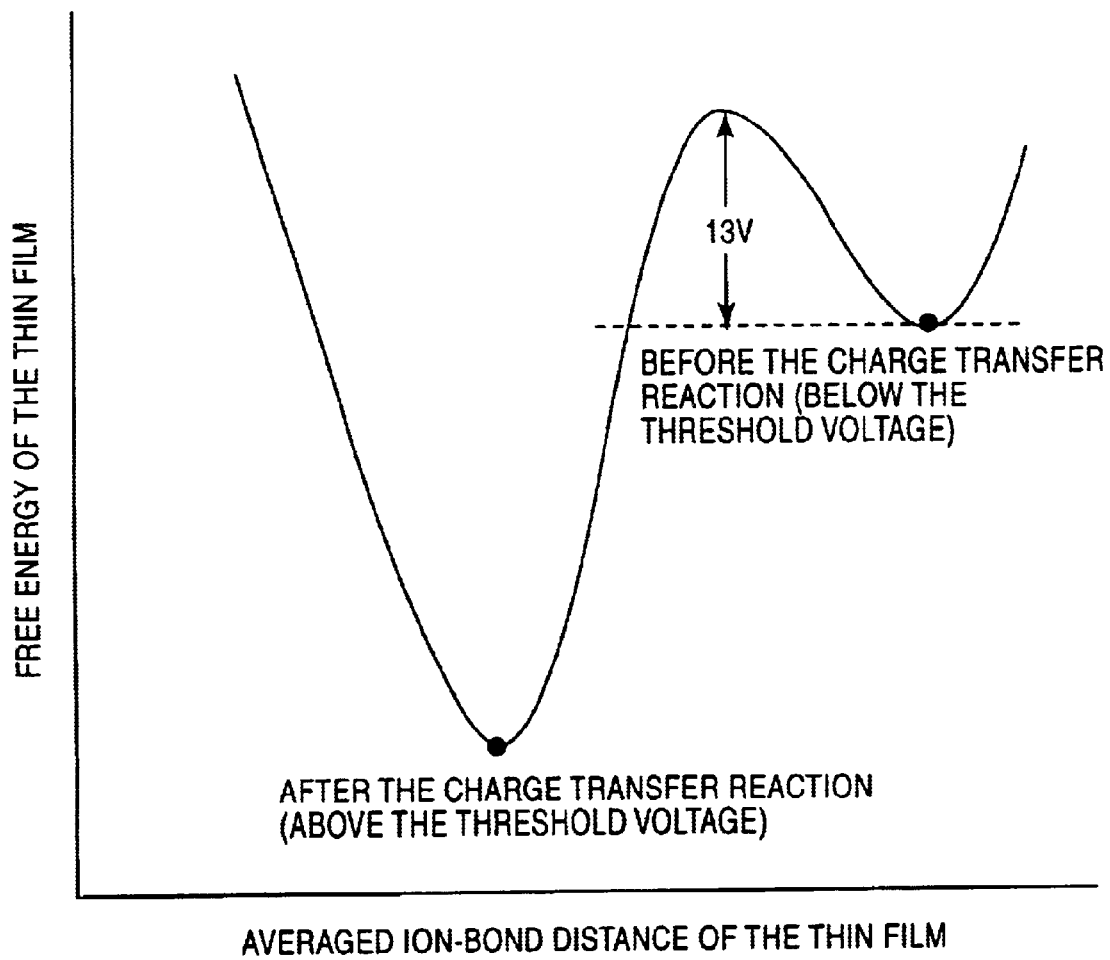
FIG. 6 illustrates a model of the energy surface and the free energy changes associated with electric double layer formation in the double layer solid-state excimer device shown in FIGS. 3A and 3B.

FIG. 6 illustrates a model of the energy surface and free-energy change associated with electric double layer formation in the double layer solid-state excimer device shown in FIGS. 3A and 3B. After the charge-transfer reaction and the resultant double layer formation were observed at 13 V, the polarity of the double layer was not reversed up to 55 V of applied AC field (55 V was the maximum voltage applied to the device so as not to destroy the device). This finding implies that the double layer formed by the charge-transfer reaction is stabilized by delocalization of holes and electrons and the structure, i.e., average ion distance, of the film is changed as is shown in FIG. 6. To certify the existence of such a structural change, a closer analysis, such as EXAFS measurements, should be required. However, at least one can imagine that a large stress is created in the device and that the double layer can be used as piezo- and pyroelectric devices as well as actuators.

Example-3

Figure 7A:
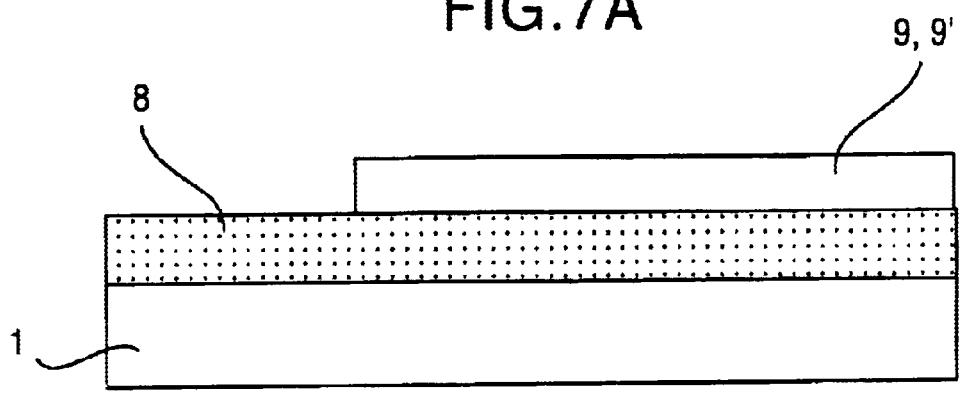
FIGS. 7A and 7B are a cross-sectional side view and a plane view, respectively, illustrating the structure of a double layer solid-state excimer device that has an ITO film doped with Xe and an ITO film doped with F.
Figure 7B:
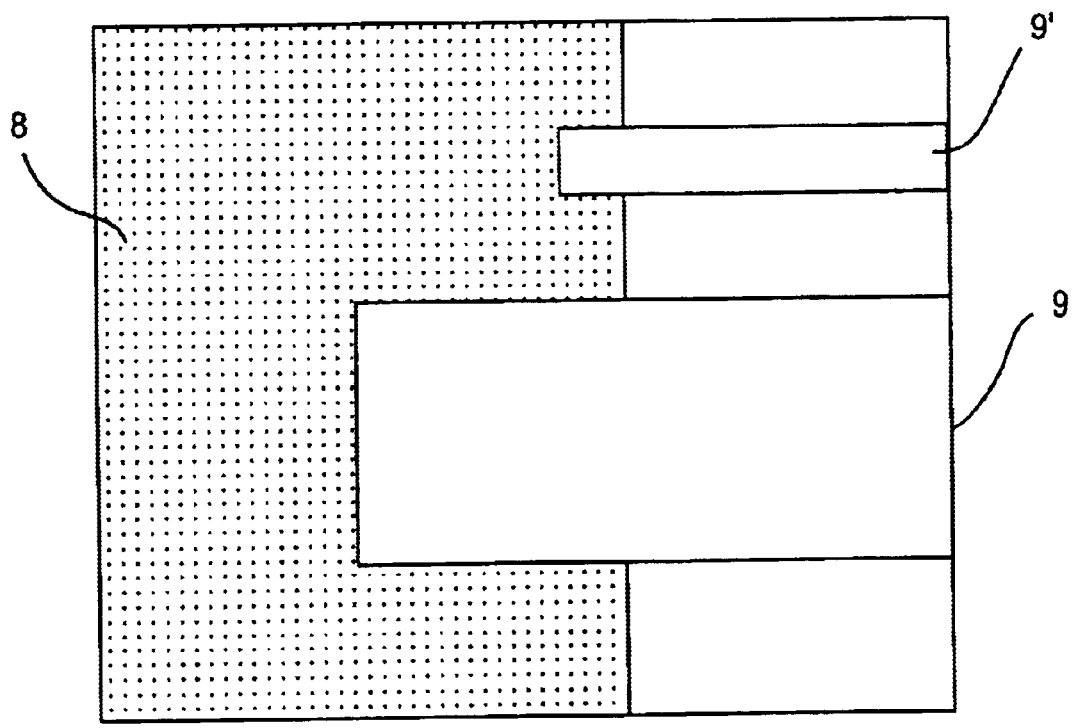

Similar to example-1, the ITO double layer was fabricated on a quartz ($SiO_2$) substrate with area of 25×25 mm$^2$ and thickness of 0.5 mm by DC sputtering of an ITO target. The fabrication conditions for the ITO were as follows:

In the first layer Xe was doped using pure Xe (99.9 vol %) as a sputtering gas.
  substrate temperature: 300° C.
  sputtering gas and flow rate: Xe, 85 cm$^3$/min
  sputtering pressure: 5×10$^{-3}$ Torr
  DC sputtering power: 54 W (600 V, 0.09 A)
  sputtering time: 20 min
In the second layer F was doped using a $F_2$ (10 vol %)/Ne (90 vol %) mixture as a sputtering gas.
  substrate temperature: 300° C.
  sputtering gas and flow rate: $F_2$ (10 vol %)/Ne (90 vol %) mixture, 100 cm$^3$/min
  sputtering pressure: 8×10$^{-3}$ Torr
  DC sputtering power: 36 W (360 V, 0.1 A)
  sputtering time: 20 min FIGS. 7A and 7B illustrate the structure of F-doped and Xe-doped ITO double layer solid-state excimer device, according to the example-3. In this experiment, F-doped layers with different areas were fabricated on the Xe-doped layer. The reference numerals 1, 8, 9 and 9' indicate the quartz substrate, the Xe-doped ITO thin film and F-doped ITO thin films (9 has a large area and 9' has a small area), respectively.

As is seen in FIG. 7B, the plane view, the second layers were fabricated onto two parts of the substrate. One is a small film and the other is a larger one, and overlaps of their areas with the first layer were 1 mm$^2$ and 5 mm$^2$, respectively. Since the ITO layers play roles as both the electrode and host material for parent atoms of excimers, the device can be operated without electrodes other than the ITO films.

The resistive property of the device was measured by connecting it to the circuit shown in FIG. 2. The resistances of the parts of the ITO double layers were 48 Ω and 1 Ω for overlap areas of 1 mm$^2$ and 50 mm$^2$, respectively. By changing the host from SiOx to ITO the resistance per area of the device was dramatically decreased compared with example-2. When 7 V was applied to this device, the parts with smaller area and larger area showed resistances of 2×10$^6$ Ω and 1×10$^5$ Ω, respectively. This device has advantages as a current limiter, since it has a small resistance below the threshold voltage.

Example-4

Figure 8A:
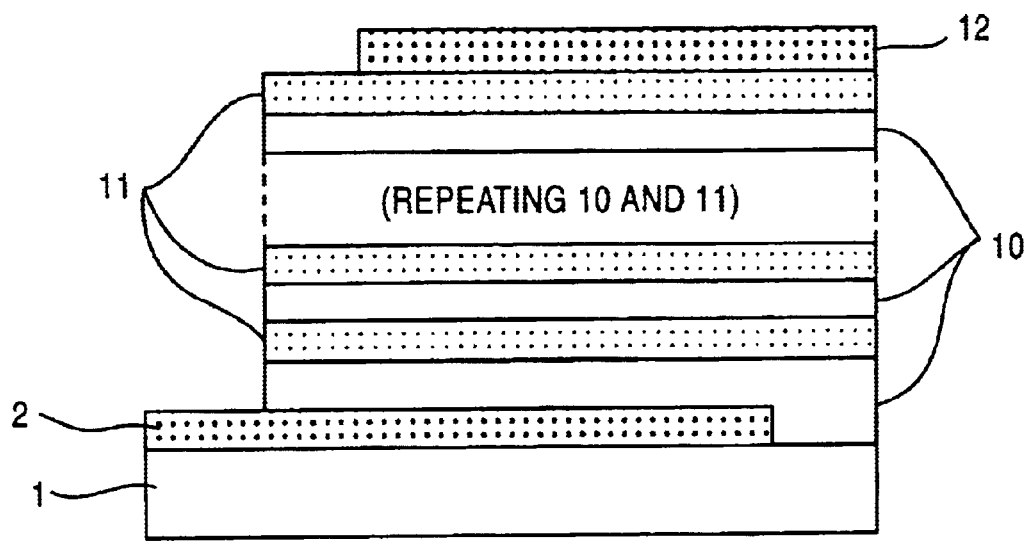
FIGS. 8A and 8B are a cross-sectional side view and a plane view, respectively, illustrating the structure of a multi layer solid-state excimer device.
Figure 8B:
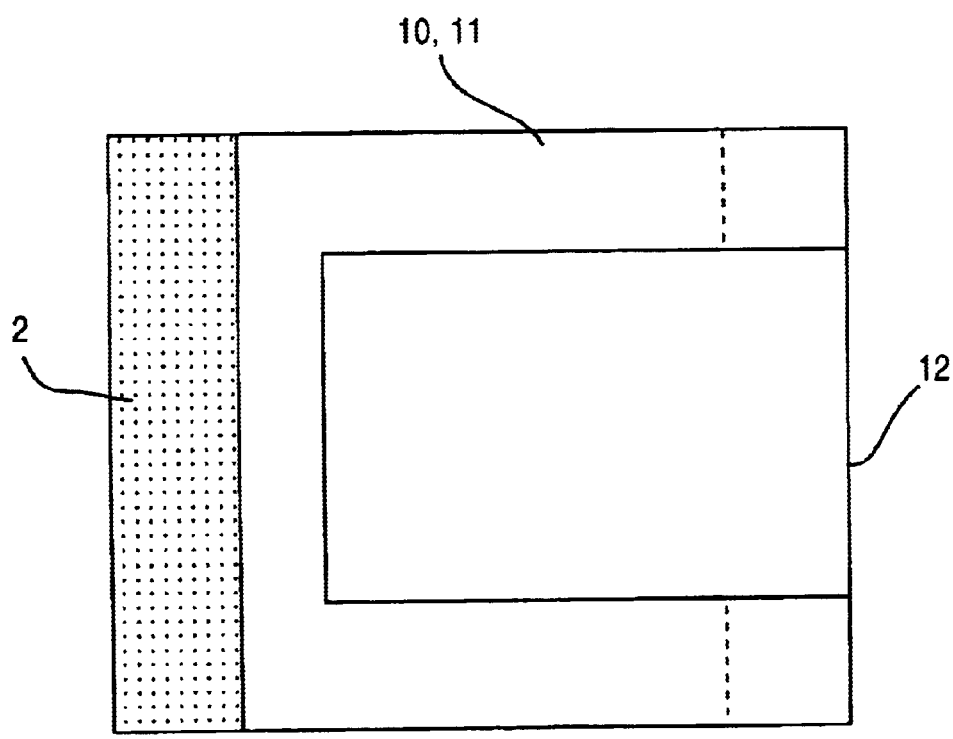

Similar to example-3, six layers of ITO were fabricated on a quartz ($SiO_2$) substrate with an area of 25×25 mm$^2$ and a thickness of 0.5 mm by DC sputtering of an ITO target. The fabrication conditions for ITO were as follows:

The first, third and fifth layers were doped with Xe using pure (99.9 vol %) Xe as a sputtering gas.
  substrate temperature: 300° C.
  sputtering gas and flow rate: Xe, 85 cm$^3$/min
  sputtering pressure: 5×10$^{-3}$ Torr
  DC sputtering power: 54 W (600 V, 0.09 A)
  sputtering time: 5 min
The second, fourth and sixth layers were doped with F using a $F_2$ (10 vol %)/Ne (90 vol %) mixture as a sputtering gas.
  substrate temperature: 300° C.
  sputtering gas and flow rate: $F_2$ (10 vol %)/Ne (90 vol %) mixture, 100 cm$^3$/min
  sputtering pressure: 8×10$^{-3}$ Torr
  DC sputtering power: 36 W (360 V, 0.1 A)
  sputtering time: 5 min FIGS. 8A and 8B illustrate the structure of the multi layer ITO device according to the example-4. The reference numerals 1, 2, 10, 11 and 12 indicate the quartz substrate, the lower ITO electrode, the Xe-doped ITO films, the F-doped ITO films and the upper ITO electrode, respectively.

The overlap area of ITO films was 50 mm$^2$, and the thickness of the six layer film was 0.3 µm in total. The device was connected to the circuit shown in FIG. 2, and the resistance without applying voltage was measured to be 2 Ω. When a voltage of 6 V was applied to the device, the resistance increased to more than 40 MΩ, the upper measurable limit of the tester, by forming electric double layers via charge-transfer reactions. Since this device has multiple electric double layers in series, the current limiting characteristics are improved compared with those in example-3.

The structure of multiple electric double layers was shown in this example, where the first and second layers were periodically fabricated in series. By applying the same scheme, multiple capacitors can be obtained on the same substrate.

By modifying example-4, a multi layer solid-state excimer device can be produced. In this case, the order of the lower and upper layers was reversed and inter-layer electrodes were inserted between the layers.

Figure 9A:
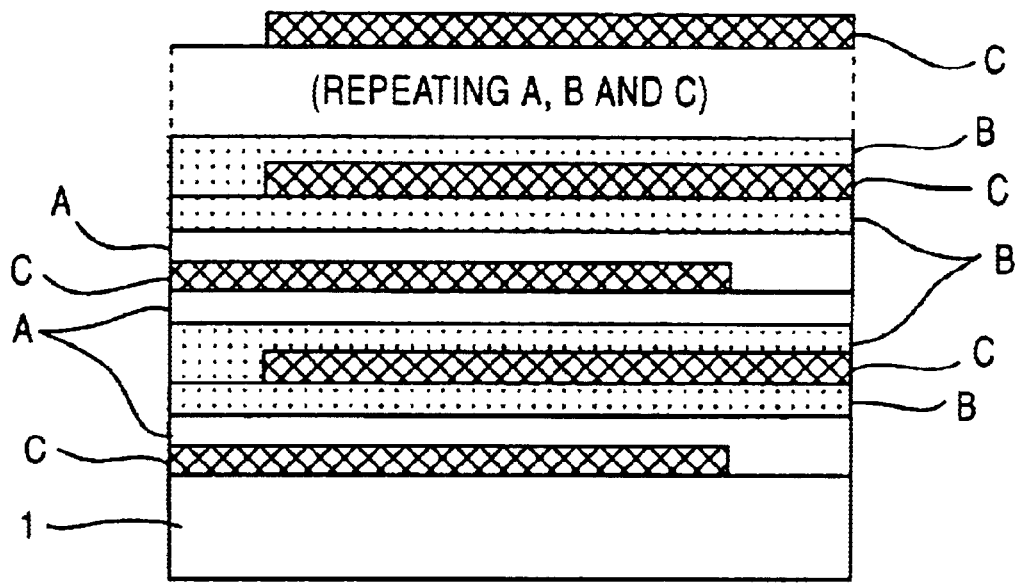
FIGS. 9A and 9B are a cross-sectional side view and a plane view, respectively, illustrating the structure of a multi layer solid-state excimer device with internal electrodes.
Figure 9B:
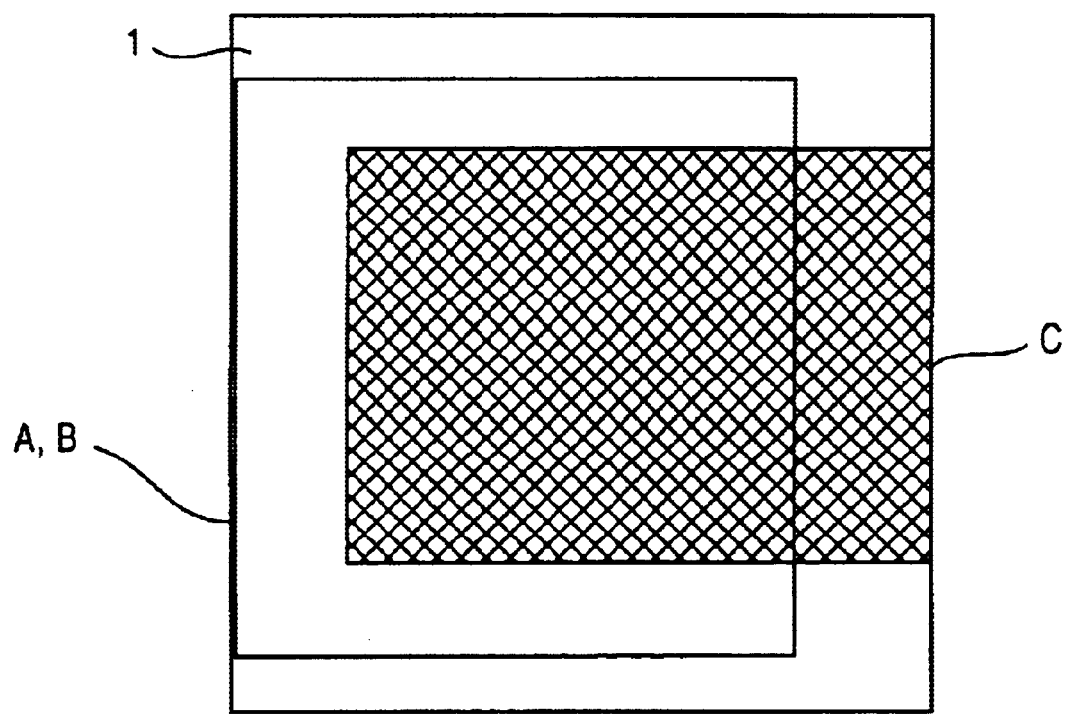

The structure of the modified multi layer solid-state excimer device with seven doped layers is illustrated in FIGS. 9A and 9B. If the first and second doped layers and electrodes shown in FIG. 8A are abbreviated as A, B and C, respectively, the structure in FIG. 9A is written using the symbols as (C) (A, B, C) (B, A, C) (A, B, C) (B, A, C) - - - .

Figure 10:
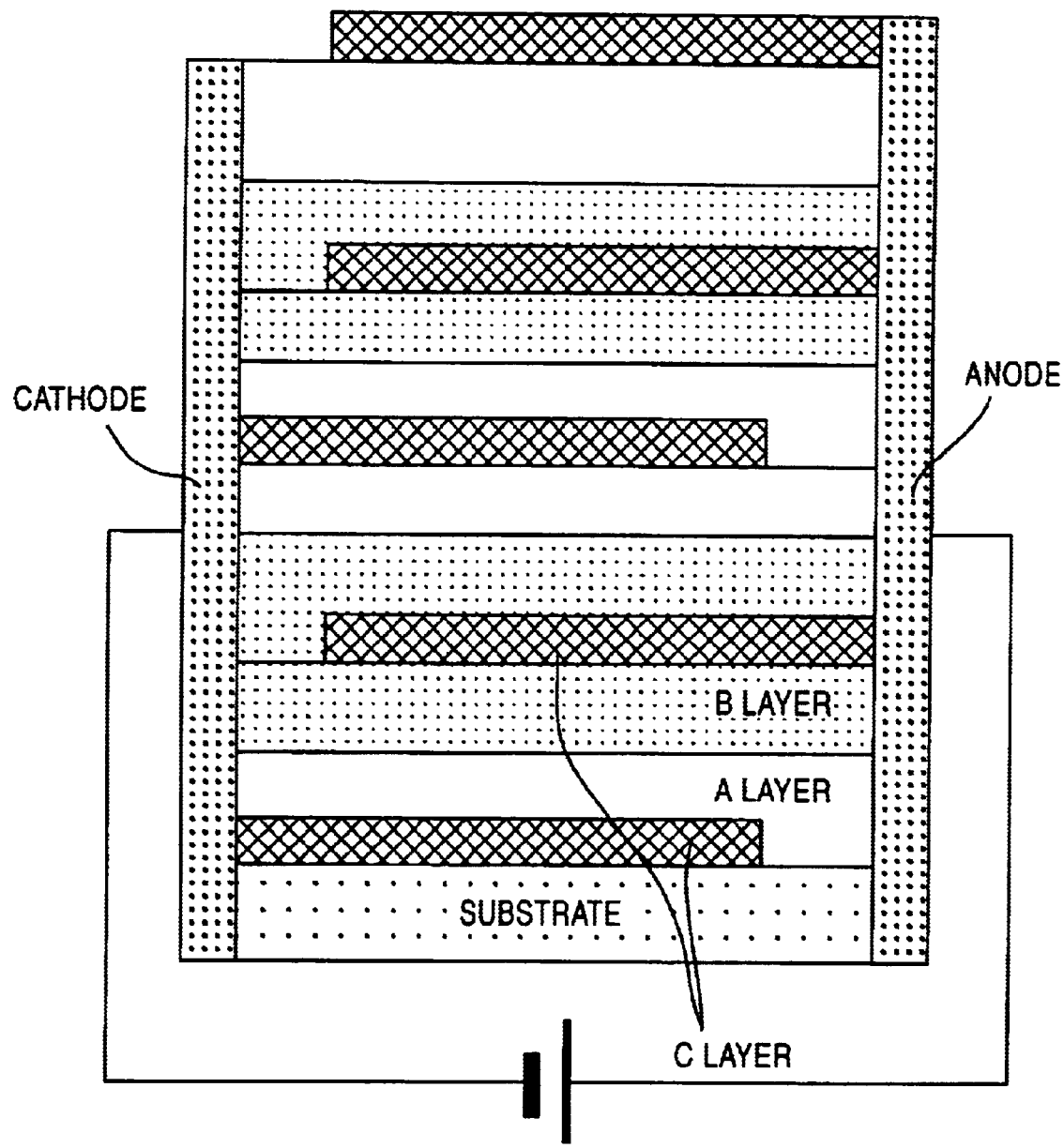
FIG. 10 illustrates a connection circuit of the anode and cathode to the multi layer solid-state excimer device with inter-layer electrodes during charging.

Each pair of thin layers forms a capacitor. By connecting the electrodes having the same polarity, the device shown in FIG. 10 is obtainable. This device, having parallel capacitors in it, will provide a large capacitance in a small volume.

Example-5

Similar to example-3, two layers of Si thin films were fabricated on a quartz ($SiO_2$) substrate with an area of 25×25 $mm^2$ and a thickness of 0.5 mm by RF sputtering of a p-type Si target with carrier density of $1\times10^{17}$. The thickness of the Si films was 0.3 μm in total. The fabrication conditions of Si films were as follows:

The first layer was doped with Xe using pure (99.9 vol %) Xe as a sputtering gas.

Substrate temperature: room temperature (the substrate was not heated)

sputtering gas and flow rate: Xe, 85 $cm^3$/min sputtering pressure: $5\times10^{-3}$ Torr DC sputtering power: 800 W sputtering time: 10 min The second layer was doped with F using a $F_2$ (10 vol %)/Ne (90 vol %) mixture as a sputtering gas.

substrate temperature: room temperature (the substrate was not heated) sputtering gas and flow rate: $F_2$ (10 vol %)/Ne (90 vol %) mixture, 100 $cm^3$/min sputtering pressure: $8\times10^{-3}$ Torr DC sputtering power: 800 W sputtering time: 10 min The structure of this device is similar to that shown in FIGS. 3A and 3B. The overlap area, which corresponds to the electrode area, of the first and second layers was 50 $mm^2$, the same as in example-3. The device was connected to the circuit shown in FIG. 2, and the resistance without applying voltage was measured to be 40 to 100 Ω. When a voltage of 8–10 V was applied to the device, the resistance increased to $5\times10^5$–$1\times10^6$ Ω. The resistance of this device was unstable, since the thin films are made of Si- semiconductors that show different resistances depending on the oxidation state of their surfaces. Packaging treatments will necessary to achieve stable surface conditions of Si films. However, semiconductors such as Si were found to be possibly useful as host materials in current-limiting devices.

What I claim is:

1. A single layer solid-state excimer device comprising a thin film formed of a material selected from insulating metal oxides, at least one dopant selected from the parent rare-gas atoms Ar, Kr and Xe of excimers, and at least one dopant selected from the parent halogen atoms F, Cl, Br and I of excimers, wherein the dopants are doped into the film during formation thereof.

2. A single layer solid-state excimer device according to claim 1, in which said insulating metal oxides are either crystalline phases, amorphous phases, or solid solutions of aluminum oxide, barium oxide, bismuth oxide, cerium oxide, cobalt oxide, copper oxide, iron oxide, gallium oxide, gadolinium oxide, germanium oxide, lanthanum oxide, lithium oxide, magnesium oxide, manganese oxide, molybdenum oxide, niobium oxide, neodymium oxide, nickel oxide, lead oxide, silicon oxide, strontium oxide, titanium oxide, vanadium oxide, tungsten oxide, yttrium oxide and zirconium oxide.

3. A double layer solid-state excimer device comprising, first and second thin films in contact with each other, each formed of the same material or different materials, respectively, selected from either one of insulating metal oxides, conductive metal oxides, group IV semiconductors, group III–V semiconductors, or group II–VI compound semiconductors, at least one dopant selected from the parent rare-gas atoms Ar, Kr and Xe of excimers and doped into one of the thin films during formation thereof, and at least one dopant selected from the parent halogen atoms F, Cl, Br and I of excimers and doped into the other of the thin-films during formation thereof.

4. A double layer solid-state excimer device according to claim 3, in which said insulating metal oxides are either crystalline phases, amorphous phases, or solid solutions of aluminum oxide, barium oxide, bismuth oxide, cerium oxide, cobalt oxide, copper oxide, iron oxide, gallium oxide, gadolinium oxide, germanium oxide, lanthanum oxide, lithium oxide, magnesium oxide, manganese oxide, molybdenum oxide, niobium oxide, neodymium oxide, nickel oxide, lead oxide, silicon oxide, strontium oxide, titanium oxide, vanadium oxide, tungsten oxide, yttrium oxide and zirconium oxide.

5. A double layer solid-state excimer device according to claim 3, in which said conductive oxides include either crystalline phases or amorphous phases of iridium oxide, tin oxide, zinc oxide, ruthenium oxide, and indium tin oxide.

6. A double layer solid-state excimer device according to claim 3, in which said group IV semiconductors include either crystalline phases or amorphous phases of silicon and germanium.

7. A double layer solid-state excimer device according to claim 3, in which said group III–V compound semiconductors include either crystalline phases, amorphous phases or solid solutions of gallium arsenide, indium phosphorus, and gallium nitride.

8. A double layer solid-state excimer device according to claim 3, in which said group II–VI compound semiconductors include either crystalline phases, amorphous phases or solid solutions of cadmium tellurium, zinc selenium, and zinc tellurium.

9. A multi layer solid-state excimer device in which a predetermined number of pairs of the thin films in the same order as in the double layer solid-state excimer device according to claim 3 are piled on top of the other.

10. A single layer solid-state excimer device according to claim 1, with a pair of electrodes provided on top and bottom surfaces of the device, an operation principle thereof is that transfer of electric charges is induced between the parent rare-gas and halogen atoms of excimers selected for dopants, when AC or DC electric field is applied across the electrodes.

11. A double layer solid-state excimer device according to claim 3, with a pair of electrodes provided on top and bottom surfaces of the device, an operation principle thereof is that a p-n junction is generated between said first and second thin films, when AC or DC electric field is applied across the electrodes.

12. A multi layer solid-state excimer device according to claim 9, with a pair of electrodes provided on top and bottom surfaces of the device, an operation principle thereof is that p-n junctions are generated within the device, when AC or DC electric field is applied across the electrodes.

13. A multi layer solid-state excimer device according to claim 9, provided with a pair of electrodes on top and bottom surfaces of the device, and inter-layer electrodes between the thin films of the device, an operation principle thereof is that p-n junctions are generated within the device, when AC or DC electric field is applied across the electrodes.

14. A process for producing the single layer solid-state excimer device according to claim 1, comprising the step of preparing a gas mixture, by selecting at least one dopant from said parent rare-gas atoms of excimers and at least one dopant from said parent halogen atoms of excimers, respectively, mixing selected dopant atoms at prescribed ratios, and giving a prescribed pressure to the gas mixture, and the step of forming and doping the thin film, by sputtering a target made of a host material selected from said insulating metal oxides, through gas-phase discharge in the gas mixture, to form the thin film of the selected host material on top of a substrate or an electrode formed on the substrate, and taking the dopant atoms from the gas mixture into the thin film which is being formed.

15. A process for producing the double layer solid-state excimer device according to claim 3, comprising, the step of preparing a first gas mixture, by selecting at least one dopant from either one of said parent rare-gas or halogen atoms of excimers, mixing the selected dopant atoms at prescribed ratios, and giving a prescribed pressure to the first gas mixture, the step of forming and doping the first thin film, by sputtering a target made of a first host material selected from either one of said insulating metal oxides, conducting metal oxides, group IV semiconductors, group III–V compound semiconductors, or group II–IV compound semiconductors, through gas-phase discharge in the first gas mixture, to form the first thin film of the first host material on top of a substrate or an electrode formed on the substrate, and taking the dopant atoms from the first gas mixture into the first thin film which is being formed, the step of preparing second gas mixture, by selecting at least one dopant from the other of said parent rare-gas or halogen atoms of excimers, mixing the selected dopant atoms at prescribed ratios, and giving a prescribed pressure to the second gas mixture, and the step of forming and doping the second thin film, by sputtering a target made of a second host material selected from either one of said insulating metal oxides, conducting metal oxides, group IV semiconductors, group III–V compound semiconductors, or group II–IV compound semiconductors, through gas-phase discharge in the second gas mixture, to form the second thin film of the second host material on top of a substrate or an electrode formed on the substrate, and taking the dopant atoms from the-second gas mixture into the second thin film which is being formed.

16. A process for producing a multi layer solid-state excimer device, comprising, first and second thin films in contact with each other, each formed of the same material or different materials, respectively, selected from either one of insulating metal oxides, conductive metal oxides, group IV semiconductors, group III–V semiconductors, or group II–VI compound semiconductors, at least one dopant selected from the parent rare-gas atoms Ar, Kr and Xe of excimers and doped into one of the thin films during formation thereof, and at least one dopant selected from the parent halogen atoms F, Cl, Br and I of excimers and doped into the other of the thin films during formation thereof in which a predetermined number of pairs of the thin films are piled on one another, wherein a compound step of preparing the first gas mixture, forming and doping the first thin film, preparing the second gas mixture, and forming and doping the second thin film, according to claim 15, respectively, is repeated a prescribed times in a stated order.

* * * * *